United States Patent
Maley et al.

(10) Patent No.: US 11,768,253 B1
(45) Date of Patent: Sep. 26, 2023

(54) FLOATING GROUND ARCHITECTURES IN USB TYPE-C CONTROLLERS FOR FAULT DETECTION

(71) Applicant: Cypress Semiconductor Corporation, San Jose, CA (US)

(72) Inventors: Kiran Kumar Reddy Maley, Telangana (IN); Ramakrishna Venigalla, Bangalore (IN); Hemant P. Vispute, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/706,481

(22) Filed: Mar. 28, 2022

(51) Int. Cl.
*G01R 31/52* (2020.01)
*H01R 13/66* (2006.01)

(52) U.S. Cl.
CPC ............ *G01R 31/52* (2020.01); *H01R 13/665* (2013.01)

(58) Field of Classification Search
CPC ............................. G01R 31/52; H01R 13/665
See application file for complete search history.

(56) References Cited

U.S. PATENT DOCUMENTS

| | | | | |
|---|---|---|---|---|
| 2014/0197843 A1* | 7/2014 | Schurman | ............... | B60L 53/14 324/509 |
| 2017/0294832 A1* | 10/2017 | Aoki | ...................... | H02M 1/32 |
| 2017/0346313 A1* | 11/2017 | Yao | ......................... | G01R 31/50 |
| 2020/0321734 A1* | 10/2020 | Vispute | .............. | H01R 13/6666 |
| 2021/0119438 A1* | 4/2021 | Cheng | ............ | H03K 19/017509 |
| 2023/0052051 A1* | 2/2023 | Itakura | ................ | G06F 13/4282 |
| 2023/0079553 A1* | 3/2023 | Nagai | ..................... | H02J 7/345 320/162 |
| 2023/0120432 A1* | 4/2023 | Womac | ................... | H02M 1/32 323/282 |

FOREIGN PATENT DOCUMENTS

| | | | | | |
|---|---|---|---|---|---|
| CN | 107431351 B | * | 1/2020 | ............... | H02H 7/12 |
| CN | 111736094 A | * | 10/2020 | ......... | G01R 19/2503 |
| CN | 114036009 A | * | 2/2022 | | |
| WO | WO-2018076623 A1 | * | 5/2018 | ............. | G01R 31/50 |

* cited by examiner

*Primary Examiner* — Patrick Assouad
*Assistant Examiner* — Demetrius R Pretlow

(57) ABSTRACT

A Universal Serial Bus Type-C (USB-C) controller with a floating ground architecture for fault detection is described. A USB-C controller includes a floating ground circuit and a fault detection circuit coupled to a power converter. The floating ground circuit provides a floating ground voltage based on a supply voltage of the power converter. The fault detection circuit includes a comparator with power rails coupled to the supply voltage and the floating ground voltage. The fault detection circuit measures a differential signal across a first terminal and a second terminal, the differential signal representing a current of the power converter. The fault detection circuit compares the differential signal against a threshold using the comparator and outputs an indication of a fault condition in response to the differential signal satisfying the threshold.

20 Claims, 6 Drawing Sheets

US 11,768,253 B1

FLOATING GROUND ARCHITECTURES IN USB TYPE-C CONTROLLERS FOR FAULT DETECTION

TECHNICAL FIELD

This disclosure relates to integrated circuits (ICs) that control Universal Serial Bus (USB) power delivery to electronic devices, including floating ground architectures in USB Type-C controllers for fault detection.

BACKGROUND

Various electronic devices (e.g., such as smartphones, tablets, notebook computers, laptop computers, hubs, chargers, adapters, etc.) are configured to transfer power through Universal Serial Bus (USB) connectors according to USB power delivery protocols defined in various revisions of the USB Power Delivery (USB-PD) specification. For example, in some applications, an electronic device may be configured as a power consumer to receive power through a USB connector (e.g., for battery charging). In contrast, in other applications, an electronic device may be configured as a power provider to provide power to another connected device through a USB connector.

BRIEF DESCRIPTION OF THE DRAWINGS

The disclosure is illustrated by way of example, and not of limitation, in the figures of the accompanying drawings.

DETAILED DESCRIPTION

Figure 1:
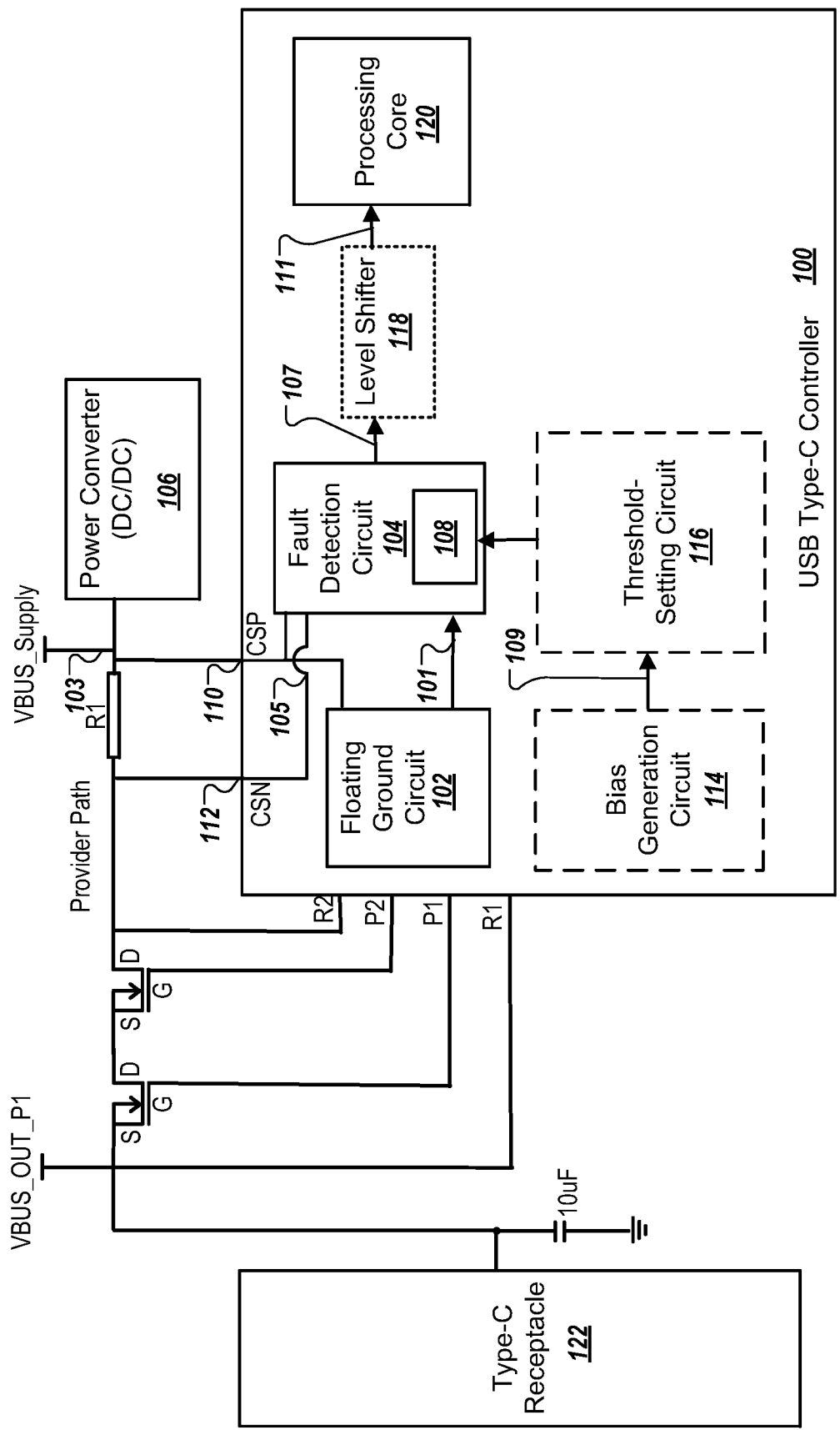
FIG. 1 is a block diagram of a Universal Serial Bus (USB) Type-C controller with a floating ground architecture for fault detection, according to at least one embodiment.

The following description sets forth numerous specific details such as examples of specific systems, components, methods, and so forth, in order to provide a good understanding of various embodiments of the techniques described herein for providing floating ground circuits for fault detection such as used in USB power delivery (PD) applications. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the invention. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples" are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for providing a Universal Serial Bus Type-C (USB-C) controller with a floating ground architecture for fault detection in electronic devices in USB-PD. Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), and other similar electronic devices that can use USB connectors (interfaces) for communication, battery charging, and/or power delivery. In at least one embodiment, a USB-C controller includes a floating ground circuit and a fault detection circuit coupled to a power converter. The floating ground circuit provides a floating ground voltage based on a supply voltage of the power converter. The fault detection circuit includes a comparator with power rails coupled to the supply voltage and the floating ground voltage. The fault detection circuit measures a differential signal between first and second terminals. The differential signal represents a current of the power converter. The fault detection circuit compares the differential signal against a threshold using the comparator and outputs an indication of a fault condition in response to the differential signal satisfying the threshold. The fault condition can be an over-current protection (OCP) condition, a reverse-current protection (RCP) condition, or a short-circuit protection (SCP) condition. The fault detection circuit can be duplicated for each fault condition to detect all three conditions. The fault detection circuit can be duplicated for additional ports as well. These technologies can be deployed in any USB-enabled device or system.

As used herein, a "USB-enabled" device or system refers to a device or system that includes, is configured with, or is otherwise associated with a USB connector interface. A USB-enabled electronic device may comply with at least one release of a Universal Serial Bus (USB) specification. Examples of such USB specifications include, without limitation, the USB Specification Revision 2.0, the USB 3.0

Specification, the USB 3.1 Specification, the USB 3.2 Specification, and/or various supplements, versions, and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C (also referred to herein as "USB-C"), is defined in various releases and/or versions of the USB Type-C specification. The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX− lines, among others. In addition, a Type-C port also provides a Sideband Use (denoted SBU) line for signaling of sideband functionality and a Configuration Channel (or communication channel, denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (SSTXP1 and SSTXP2), two SSTX− lines (SSTXN1 and SSTXN2), two SSRX+ lines (SSRXP1 and SSRXP2), two SSRX− lines (SSRXN1 and SSRXN2), two CC lines (CC1 and CC2), and two SBU lines (SBU1 and SBU2), among others.

Some USB-enabled electronic devices may comply with a specific revision and/or version of the USB-PD specification. The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that both devices can accommodate, and can be dynamically re-negotiated (e.g., without device un-plugging) upon request by either device and/or in response to various events and conditions, such as power role swap, data role swap, hard reset, failure of the power source, etc. As used herein, "USB-PD subsystem" refers to one or more logic blocks and other analog/digital hardware circuitry, which may be controllable by firmware in an IC controller and which is configured and operable to perform the functions and to satisfy the requirements specified in at least one release of the USB-PD specification. The IC controller can be implemented in a USB Type-C device. The IC controller can be implemented in a USB device.

Power delivery in accordance with the USB-PD specification(s) can be embodied in several different types of USB Type-C applications. Examples of such types of Type-C applications include, but may not be limited to: a downstream facing port (DFP) application, in which an IC controller with a USB-PD subsystem is configured to provide a downstream-facing USB port (e.g., in a USB-enabled host device); an upstream facing port (UFP) application, in which an IC controller with a USB-PD subsystem is configured to provide an upstream-facing USB port (e.g., in a USB-enabled peripheral device or adapter); a dual role port (DRP) USB application, in which an IC controller with a USB-PD subsystem is configured to support both DFP and UFP applications on the same USB port (e.g., a USB Type-C port that is configured to operate as either a power provider or a power consumer or can alternate between these two roles dynamically by using USB-PD power role swap); and an active cable application, in which an IC controller with a USB-PD subsystem is disposed into, and configured to operate an electronically marked cable assembly (EMCA) Type-C cable.

Existing solutions for fault detection use a common gate amplifier in a first stage and two comparators in a second stage to detect an OCP condition and an SCP condition. The common gate amplifier translates a differential signal across an external resistor (Rsense) coupled to two terminals to a ground-referenced signal and compares the translated signal against two reference voltages using the comparators to produce indicator outputs corresponding to the OCP condition and the SCP condition. A separate common gate amplitude and comparator are needed for the RCP condition. The separate common gate amplifier translates a voltage differential across an external resistor (Rsense) to the ground-referenced signal and the comparator compares it to a reference voltage to detect the RCP condition. The common gate amplifier bandwidth limits the detection speed for the SCP and RCP. The need for a separate common gate amplifier for RCP implementation also adds to a higher silicon area (e.g., 0.5 mm² for the two common gate amplifiers). Also, for ultra-high voltage (UHV) tolerant fault detection schemes, UHV devices (e.g., 20-40V transistors) are needed in the amplifier circuitry. The UHV devices, in the current sense amplifiers, limit bandwidth.

Aspects of the present disclosure address the deficiencies described above and other challenges by providing a floating ground architecture in the USB Type-C controller for fault detection schemes. Aspects of the present disclosure can improve detection speed for SCP, RCP, and OCP since the floating ground architectures do not use a common gate amplifier that limits bandwidth. Portions of the floating ground architecture can be duplicated for each fault condition in highly-efficient area implementations for OCP, SCP, and RCP detections. Aspects of the present disclosure can have a die area savings of 0.5 mm² for a two-port part, since no common gate amplifiers are used. Aspects of the present disclosure can achieve the same fault detection speed for all fault conditions—OCP, SCP, and RCP, resulting in improved performance. Aspects of the present disclosure can provide scalability by the floating ground architecture being scalable from one silicon technology to another. Aspects of the present disclosure can provide improved performance by using 5V or less transistors instead of 20/40V transistors, which increases the speed of the detection paths. Aspects of the present disclosure can provide improved performance by providing a scalable voltage architecture between approximately 3.3V to approximately 30V.

FIG. 1 is a block diagram of a Universal Serial Bus (USB) Type-C controller 100 with a floating ground architecture for fault detection, according to at least one embodiment. The USB Type-C controller 100 includes a floating ground circuit 102 and a fault detection circuit 104, each coupled to a power converter 106. The power converter 106 can be a provider-side regulator. Alternatively, the power converter 106 can be a direct current (DC)/DC converter. Alternatively, other types of power sources can be used for power delivery. The floating ground circuit 102 provides a floating ground voltage 101 based on a first supply voltage 103 (VBUS_Supply) of the first power converter 106.

The fault detection circuit 104 includes a comparator 108 with power rails being coupled to the first supply voltage 103 and the floating ground voltage 101. The fault detection circuit 104 measures a differential signal 105 across a first terminal 110 and a second terminal 112. The differential signal 105 represents a current of the power converter 106. The comparator 108 compares the differential signal against a first threshold and outputs an indication 107 of a fault condition in response to the differential signal satisfying the first threshold. The fault condition can be an over-current protection (OCP) condition, a reverse-current protection (RCP) condition, or a short-circuit protection (SCP) condition. Alternatively, other fault conditions can be detected, such as voltage conditions or other current conditions. Because of the floating ground circuit 102, the fault detection circuit 104 can be duplicated for each fault condition in an area-efficient manner, one fault detection circuit for OCP, another fault detection circuit for SCP, and another fault detection circuit for RCP. Since the floating ground circuit 102 does not include a common gate amplifier that limits bandwidth, the fault detection circuit 104 can improve detection speed for SCP, RCP, and OCP and achieve the same speed for all types of fault conditions. Because of the floating ground circuit 102, the fault detection circuit 104 can use 5V transistors and support higher voltages in a voltage range of 3.3V to 30V from the power converter 106. In at least one embodiment, the power converter 106 is configured to operate in a first voltage range between approximately 3.3 volts to approximately 30 volts.

In a further embodiment, the USB Type-C controller 100 includes a bias generation circuit 114 and a threshold-setting circuit 116. The bias generation circuit 114 generates and provides a bias voltage 109 to the threshold-setting circuit 116. The bias generation circuit 114 can generate the bias voltage 109 based on a system power supply (not illustrated). The bias generation circuit 114 can be programmable. Similarly, the threshold-setting circuit 116 can be programmable to set different threshold settings of the fault detection circuit 104. A resistor network can be coupled between the first and second terminals 110, 112, and the comparator 108 of the fault detection circuit 104. The threshold-setting circuit 116 can set a threshold for the particular fault condition monitored by the fault detection circuit 104. In another embodiment, the threshold-setting circuit 116 can control the threshold of the comparator 108. In at least one embodiment, the threshold-setting circuit 116 can cancel an offset of the comparator.

In a further embodiment, the indication 107 from the fault detection circuit 104 can be at a first level that needs to be adjusted to a second level. In at least one embodiment, a level-shifter circuit 118 is coupled to an output of the fault detection circuit 104 (e.g., the output of comparator 108). The level-shifter circuit 118 adjusts a first output signal (indication 107) from the fault detection circuit 104 to a second output signal. The second output signal also includes an indication 111 of the fault condition. The indication 111 can be provided to another circuit, such as processing core 120. Alternatively, the indication 111 can be input into another circuit or additional logic.

In other embodiments, the USB Type-C controller includes one or more floating ground circuits 102, multiple fault detection circuits 104, multiple threshold-setting circuits 116, and one or more bias generation circuits 114 for multiple fault conditions. In at least one embodiment, the USB Type-C controller includes one or more floating ground circuits 102, three fault detection circuits 104, three threshold-setting circuits 116, and one or more bias generation circuits 114. The first floating ground circuit, the first fault detection circuit, and the first threshold-setting circuit can detect an OCP condition. The second floating ground circuit, the second fault detection circuit, and the second threshold-setting circuit can detect an SCP condition. The third floating ground circuit, the third fault detection circuit, and the third threshold-setting circuit can detect an RCP condition.

In at least one embodiment, the first fault detection circuit and the second fault detection circuit (and the third fault detection circuit) can be coupled to a first power converter. The power rails of each fault detection circuit can be coupled to the first supply voltage and the respective floating ground voltage from the respective floating ground circuit. Each threshold-setting circuit can set the respective threshold to detect the respective fault condition and output an indication of the respective fault condition.

In other embodiments, the USB Type-C controller 100 can also support other types of USB receptacles and power converters. Although the USB Type-C controller 100 is illustrated for one port (one Type-C receptacle 122, the USB Type-C controller 100 can support multiple ports (two or more Type-C receptacles), as illustrated in FIG. 2.

Figure 2:
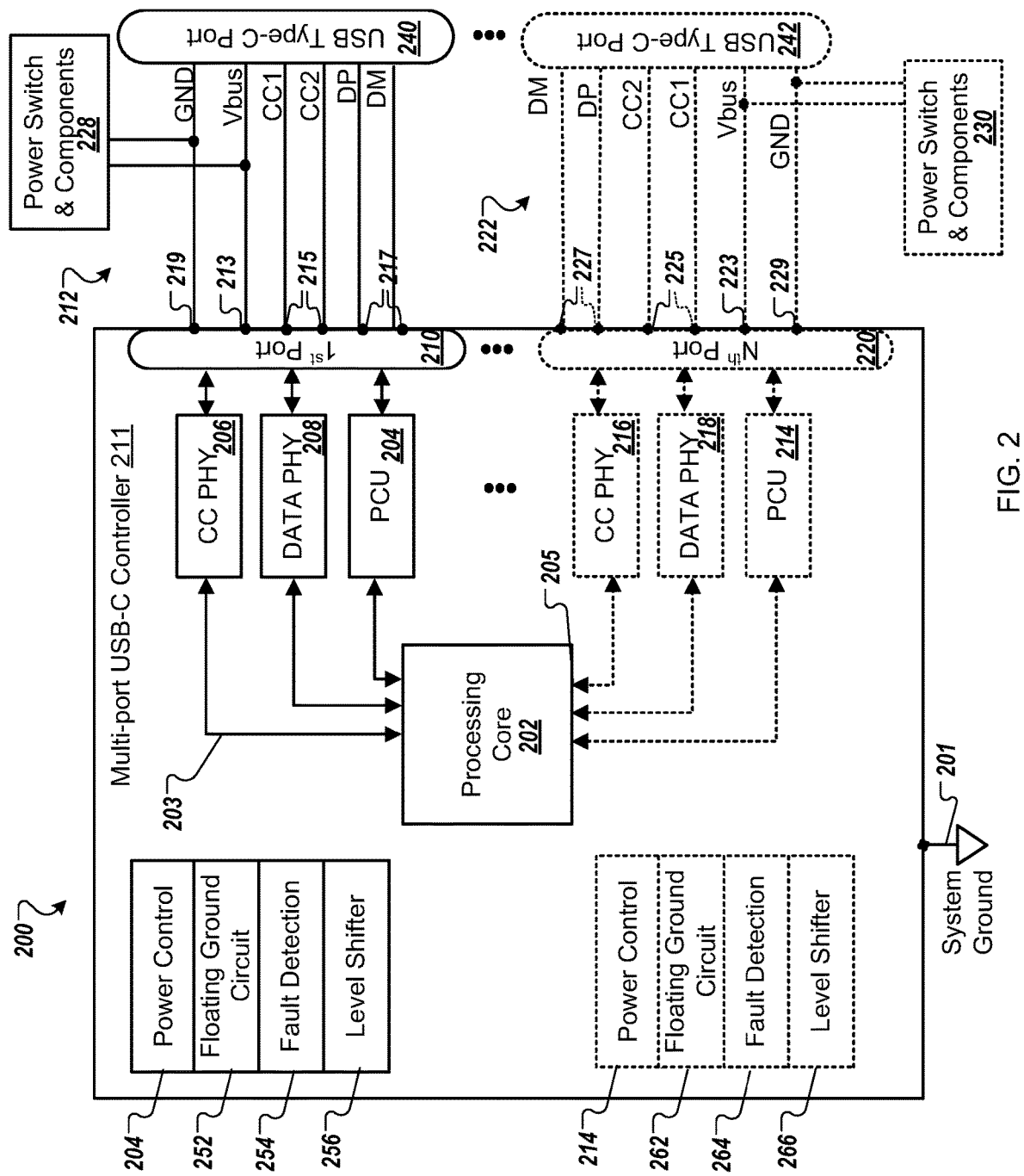
FIG. 2 is a block diagram of a multi-port USB power delivery (USB-PD) device with floating ground circuits for fault detection, according to at least one embodiment.

FIG. 2 is a block diagram of a multi-port USB-PD device 200 with floating ground circuits for fault detection according to one embodiment. The multi-port USB-PD device 200 includes a multi-port USB-C controller 211 (hereinafter "USB-C controller"). The USB-C controller 211 may be disposed in a chip package and includes a USB-PD subsystem configured in accordance with the techniques for floating ground circuits for fault detection described herein. The USB-C controller 211 is configured to negotiate a PD contract with a consumer device (not shown) attached to USB Type-C port 240 and control through an output terminal the required VBUS voltage. USB Type-C port 240 is can also be referred to as a USB Type-C connector and is typically associated with a Type-C plug, but it should be understood that in various embodiments, the USB Type-C port may be associated with a Type-C receptacle instead. The USB-C controller 211 is configured to negotiate a PD control with other consumer devices attached to other USB Type-C ports, including an $N^{th}$ USB Type-C port 242.

In at least one embodiment, the USB Type-C port 240 is coupled to a first port 210 of the USB-C controller 211 via a first set of conductors 212. A second USB Type-C port is coupled to a second port of the USB-C controller 211 via a second set of conductors. An Nth USB Type-C port 242 is coupled to an Nth port 220 of the USB-C controller 211 via an Nth conductor 222. For simplicity, the first and Nth ports 210, 220 are referred to as first and second ports 210, 220, respectively.

In at least one embodiment, the USB-C controller 211 includes a system ground terminal 201, the first port 210, and the second port 220. The first port 210 includes a first VBUS terminal 213, a first power supply ground terminal 219, CC terminals 215, and data terminals 217, and the second port 220 includes a second VBUS terminal 223, a second power supply ground terminal 229, CC terminals 225, and data terminals 227. The first port 210 couples to the first USB-C port 240 via the first set of conductors 212. The first port 210 includes at least a first VBUS terminal 213, a first power supply ground terminal 219, a first CC terminal (CC1), a second CC terminal (CC2). In another embodiment, the first port 210 also includes a first data terminal (DP) and a second data terminal (DM). The second port 220 couples to the second USB-C port 242 via the second set of conductors 222. The second port 220 includes at least a second VBUS terminal 223, a second power supply ground terminal 229, a first CC terminal (CC1), a second CC terminal (CC2). In another embodiment, the second port 220 also includes a first data terminal (DP) and a second data terminal (DM).

In at least one embodiment, the USB-C controller 211 includes a first floating ground circuit 252, a first fault detection circuit 254, and a first level-shifter circuit 256 for detecting faults associated with the power switch and components 228. The USB-C controller 211 includes a second floating ground circuit 262, a second fault detection circuit 264, and a second level-shifter circuit 266 to detect faults associated with the power switch and components 230. The first floating ground circuit 252 and the second floating ground circuit 262 are similar to the floating ground circuit 102 of FIG. 1. The first fault detection circuit 254 and the second fault detection circuit 264 are similar to the fault detection circuit 104 of FIG. 1. The first level-shifter circuit 256 and the second level-shifter circuit 266 are similar to the level-shifter circuit 118 of FIG. 1.

In at least one embodiment, the second floating ground circuit is coupled to a second power converter. It provides a second floating ground voltage based on a second supply voltage of the second power converter. The second fault detection circuit is also coupled to the second power converter. The second fault detection circuit includes a second comparator with power rails of the second comparator being coupled to the second supply voltage and the second floating ground voltage. The second fault detection circuit measures a second differential signal across a resistor coupled between a third terminal (VBUS) and a fourth terminal. The second differential signal represents a second current of the second power converter. Using the second comparator, the second fault detection circuit compares the second differential signal against a second threshold. The second fault detection circuit outputs a second indication of a second fault condition in response to the second differential signal satisfying the second threshold.

In at least one embodiment, the USB-C controller 211 operates on voltage supplies ranging between approximately 1.8V to approximately 5V. In contrast, the power converters can operate in a voltage range between approximately 3.3V to approximately 30V.

In at least one embodiment, the USB-C controller 211 includes a first power control circuit (PCU) 204 coupled to the system ground terminal 201 and the first port 210. The first PCU 204 can adjust a first VBUS signal on the first VBUS terminal. The USB-C controller 211 includes a second PCU 214 coupled to the system ground terminal 201 and the second port 220. The second PCU 214 can adjust a second VBUS signal on the second VBUS terminal.

In at least one embodiment, the USB-C controller 211 includes a first CC physical interface 206 coupled to the first ground terminal, the first CC terminal, and the second CC terminal of the first port 210. The USB-C controller 211 includes a second CC physical interface 216 coupled to the second ground terminal, the first CC terminal, and the second CC terminal of the second port 220. The first CC physical interface 206 operates at the same first ground potential as the USB Type-C port 240 (e.g., first USB-C connector). The second CC physical interface 216 operates at the same second ground potential as the USB Type-C port 242 (e.g., second USB-C connector).

In at least one embodiment, the USB-C controller 211 includes a processing core 202 coupled to the first PCU 204 and the second PCU 214. The processing core 202 is configured to send or receive first control signals 203 using the first CC physical interface 206 and send or receive second control signals 205 using the second CC physical interface 216.

In at least one embodiment, the USB-C controller 211 includes a first data physical interface 208 coupled to a first data terminal and a second data terminal of the first port 210. The first data physical interface 208 operates at the same first ground potential as the USB Type-C port 240 (e.g., first USB-C connector). The USB-C controller 211 includes a second data physical interface 218 coupled to a third data terminal and a fourth data terminal of the second port 220. The second data physical interface 218 operates at the same second ground potential as the USB Type-C port 242 (e.g., second USB-C connector).

In at least one embodiment, the USB-C controller 211 is coupled to a power and switch components 228. The power and switch components 228 can include a four-switch buck-boost DC-DC converter. The switches can be external NFETs.

The embodiments described herein can be implemented in a power delivery system, such as a serial bus-compatible power supply device. An example of a serial bus-compatible power supply device may include a serial bus power delivery (SBPD) device, a USB-compatible power supply device, or the like. In some embodiments, the SBPD device is a multi-port USB-PD device compatible with the USB-PD standard or, more generally, with the USB standard. For example, the SBPD device may provide an output voltage (e.g., VBUS_C, power supply voltage) based on an input voltage (e.g., VBUS_IN, power supply voltage) on each of the multiple ports. The SBPD device may include the various embodiments described herein to facilitate communications between a primary-side controller and a secondary-side controller. The SBPD device may include a power converter (e.g., an AC-DC converter) and a power control analog subsystem (e.g., a USB-PD controller). The power control analog subsystem may include the circuitry, functionality, or both, as described herein for communicating information across a galvanic isolation barrier.

In embodiments, the SBPD device is connected to a power source, such as a wall socket power source that provides AC power. In other embodiments, the power source may be a different power source, such as a vehicle battery, and may provide DC power to the SBPD device. The power converter may convert the power received from a power source (e.g., convert power received to VBUS_IN, ranging from 3.3V to 21.5V). For example, a power converter may be an AC-DC converter and convert AC power from the power source to DC power. In some embodiments, the power converter is a flyback converter, such as a secondary-controlled flyback converter, that provides galvanic isolation between the input (e.g., primary side) and the output (e.g., secondary side). In another embodiment, the device may be a consumer device receiving power from the SBPD device. The consumer device may control the gate-source voltage of its provider FET with a secondary gate driver integrated onto the secondary-side controller of the consumer device.

In some embodiments, the SBPD device provides VBUS_C to a sink device (e.g., via a Configuration Channel (CC) specifying a particular output voltage and possibly an output current). SBPD device may also provide access to ground potential (e.g., ground) to the sink device. In some embodiments, the providing of the VBUS_C is compatible with the USB-PD standard. The power control analog subsystem may receive VBUS_IN from the power converter, and the power control analog subsystem may output VBUS_IN. The power control analog subsystem is a USB Type-C controller compatible with the USB Type-C standard in some embodiments. The power control analog subsystem may provide system interrupts responsive to the VBUS_IN and the VBUS_C.

In some embodiments, any of the components of the SBPD device may be part of an IC, or alternatively, any of the components of the SBPD device may be implemented in its own IC. For example, the power converter and the power control analog subsystem may be discrete ICs with separate packaging and terminal configurations.

In some embodiments, the SBPD device may provide a complete USB Type-C and USB-Power Delivery port control solution for notebooks, dongles, monitors, docking stations, power adapters, vehicle chargers, power banks, mobile adaptors, and the like.

Figure 3:
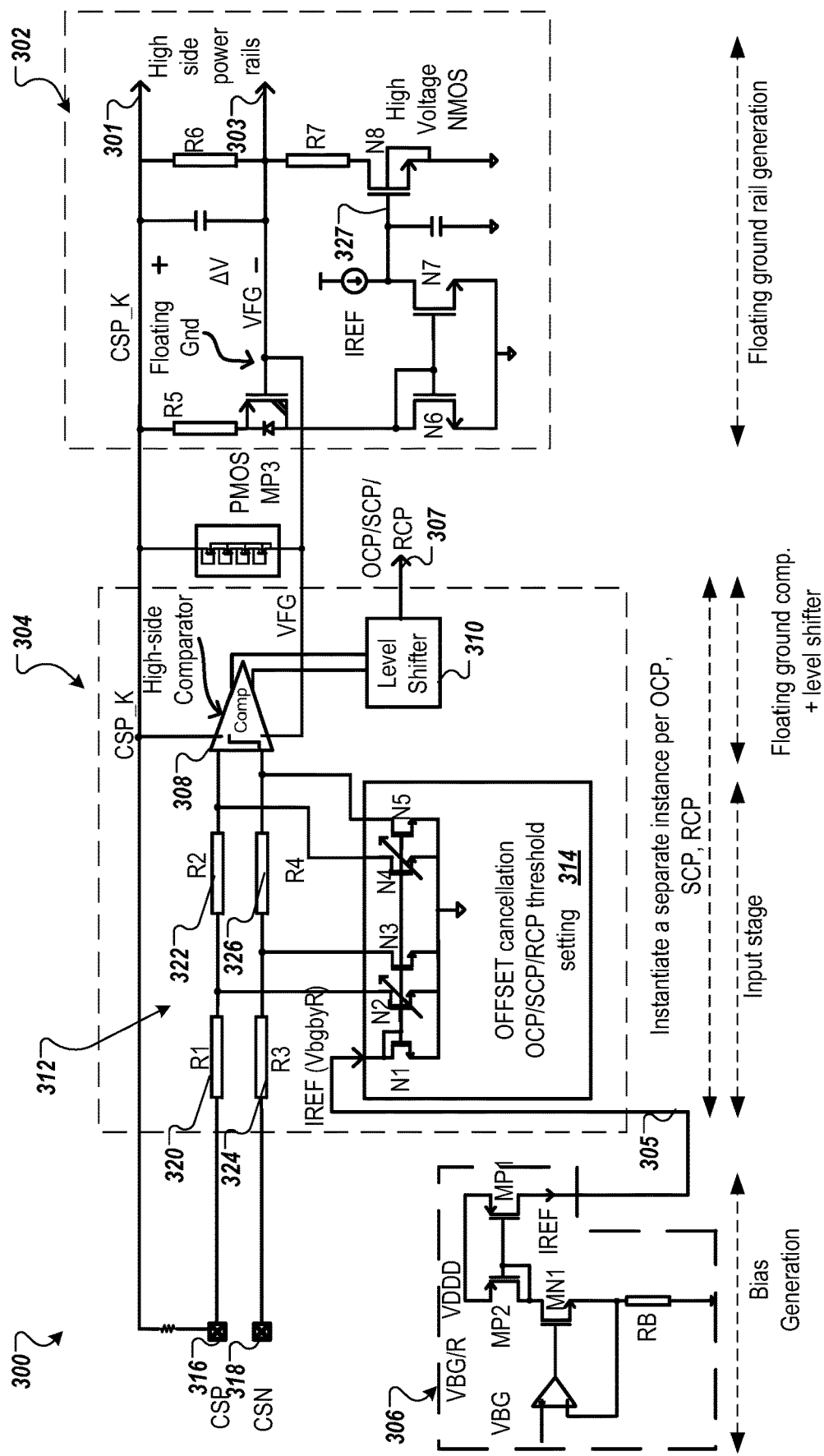
FIG. 3 is a block diagram of detection circuitry with a floating ground circuit and a fault detection circuit, according to at least one embodiment.

FIG. 3 is a block diagram of detection circuitry 300 with a floating ground circuit 302 and a fault detection circuit 304, according to at least one embodiment. The floating ground circuit 302 provides high-side power rails to the fault detection circuit 304, including a supply voltage 301 (CSP_K) and a floating ground voltage 303 (labeled as VFG). The floating ground voltage 303 can be set to have an offset or delta from the supply voltage 301. In at least one embodiment, the delta is 3V. The current through the resistor R6 between supply voltage 301 and floating ground voltage 303 is controlled to maintain the offset or delta using feedback loop. The voltage across the supply voltage 301 and floating ground voltage 303 is converted into current using resistor R5 and PMOS MP3. The current through the resistor R5 is then compared with reference current Iref using the current mirror N6-N7. The feedback loop is closed by connecting current comparison voltage 327 to gate of a high-voltage NMOS N8 (e.g., 42V NMOS) thus modulating the current through resistor R6 to maintain fixed offset or delta between the supply voltage 301 and floating ground voltage 303. In at least one embodiment, the power rails are coupled to a comparator 308 of the fault detection circuit 304. By providing the floating ground voltage 303 to be within the offset or delta from the supply voltage 301, the comparator 308 can be built with 5V semiconductor devices (or lower voltage devices), even if the supply voltage 301 is higher voltages like 20-30V. In at least one embodiment, a power converter is configured to operate in a first voltage range between approximately 3.3 volts to approximately 30 volts. That is, the supply voltage 301 can be a voltage in the first range. The fault detection circuit 304 is configured to operate in a second voltage range between approximately 3V to approximately 5V because of the floating ground circuit 302 is controlled to maintain the offset or delta. In at least one embodiment, the power converter can operate at a maximum voltage higher than 5V and the fault detection circuit 304 can operate at approximately absolute 5V or less or 5V difference between the first terminal 316 (CSP) and the floating ground voltage 303 (VFG).

As illustrated in FIG. 3, the fault detection circuit 304 includes an input stage before the comparator 308 and level-shifter circuit 310. The input stage can include a resistor network 312 and a threshold-setting circuit 314. The resistor network 312 is coupled between the comparator 308 and a first terminal 316 and a second terminal 318. The threshold-setting circuit 314 is coupled between the comparator 308 and the first and second terminals 316, 318. The first threshold-setting circuit 314 control or set a threshold of the comparator 308. In at least one embodiment, the resistor network 312 includes a first resistor 320 and a second resistor 322 coupled in series between the first terminal 316 and a first input of the comparator 308. The resistor network 312 also includes a third resistor 324 and a fourth resistor 326 coupled in series between the second terminal 318 and a second input of the comparator 308. The threshold-setting circuit 314 is coupled to a first node between the first resistor 320 and the second resistor 322, a second node between the second resistor 322 and the first input of the comparator 308, a third node between the third resistor 324 and the fourth resistor 326, and a fourth node between the fourth resistor 326 and the second input of the comparator 308. The threshold-setting circuit 314 can include one or more programmable transistors coupled to one or more of the first node, the second node, the third node, and/or the fourth node to define a threshold of the comparator 308 in connection with the resistor network 312. Once the input stage is set, a differential signal on the first terminal 316 and the second terminal 318 can be compared by the comparator 308. The threshold-setting circuit 314 can cancel an offset in the differential signal to detect a specific fault condition, such as OCP, SCP, or RCP conditions. In at least one embodiment, the threshold-setting circuit 314 can cancel a first offset between a first signal at the first node and a second signal at the third node and a second offset between the first signal at the second node and the second signal at the fourth node.

In at least one embodiment, the threshold-setting circuit 314 is biased by a bias signal 305. The bias signal 305 can be a bias voltage or a bias current, and the bias signal 305 can be generated by a bias generation circuit 306. Alternatively, the bias signal 305 can be provided by other circuits.

In at least one embodiment, the bias generation by the bias generation circuit 306 and the floating ground generation by the floating ground circuit 302 can be used for three separate instantiations of the fault detection, including the input stage for the different thresholds and the floating ground comparison and level-shifting stage. That is, at least portions of the fault detection circuit 304 (or all of the fault detection circuit 304) can be duplicated for each fault condition being monitored. For example, each instantiation of the threshold-setting circuit 314 can perform offset cancelation for threshold setting for one of the fault conditions (e.g., OCP, SCP, RCP). The respective level-shifter circuit 310 can output an indication 307 of the respective fault condition (e.g., OCP, SCP, RCP) in response to a comparison of the differential signal against the respective threshold for the respective fault condition. In other embodiments, multiple bias generation circuits 306 can be used when multiple fault detection circuits 304 are used. Similarly, multiple floating ground circuits 302 can be used when multiple fault detection circuits 304 are used.

Figure 4:
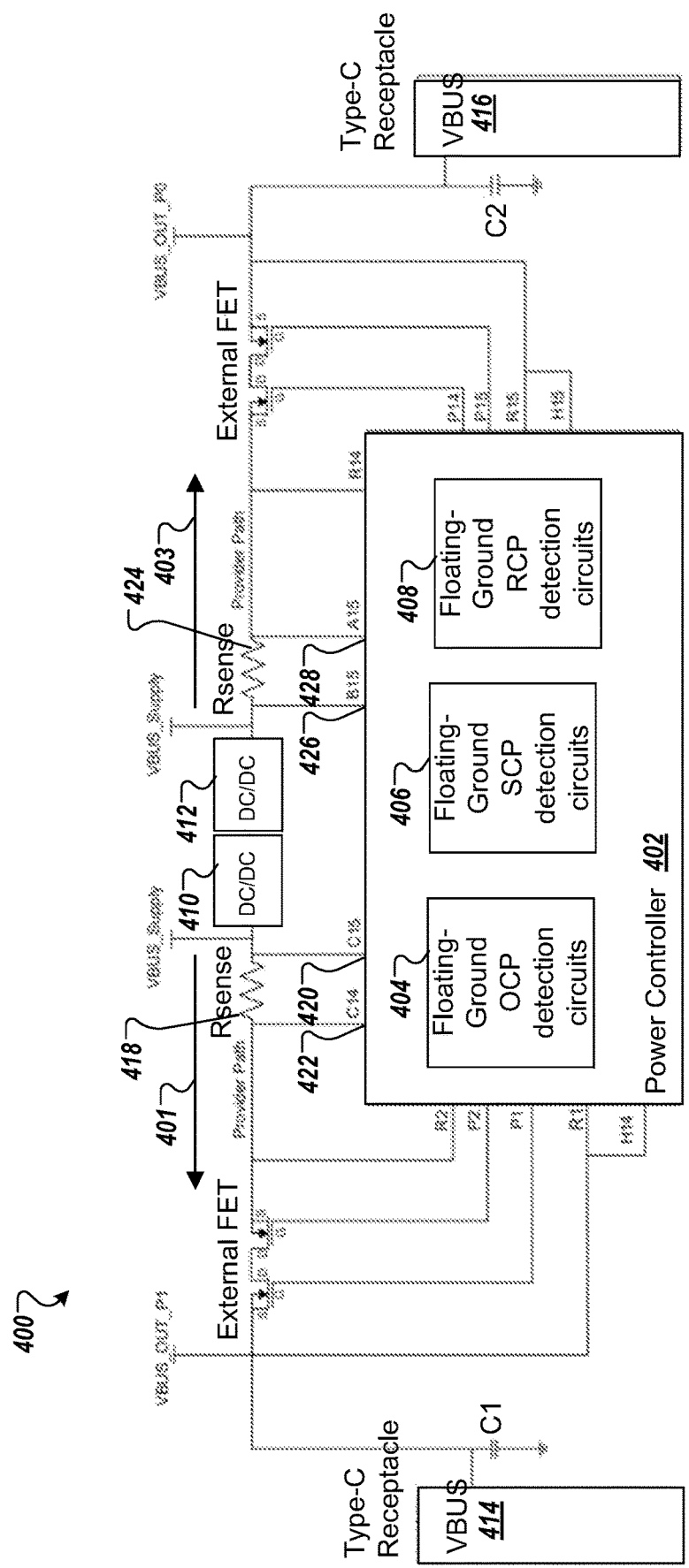
FIG. 4 is a two-port charger system with a power controller with floating-ground detection circuits for fault detection, according to at least one embodiment.

FIG. 4 is a two-port charger system 400 with a power controller 402 with floating-ground detection circuits for fault detection, according to at least one embodiment. The two-port charger system 400 includes two power converters 410, 412 to supply power to USB Type-C receptacles 414, 416, respectively. The power controller 402 uses the floating-ground detection circuits to detect fault conditions in a first supply current 401 provided by the first power converter 410 and fault conditions in a second supply current 403 provided by the second power converter 412. The power controller 402 can measure the first supply current 401 using a first resistor 418 coupled between two terminals 420, 422. The power controller 402 can measure the first supply current 401 as a differential voltage signal at the two terminals 420, 422. The power controller 402 can measure the second supply current 403 using a second resistor 424 coupled between two terminals 426, 428. The power controller 402 can measure the second supply current 403 as a differential voltage signal at the two terminals 426, 428. The differential voltage signal can be input into the floating-ground detection circuits to detect the fault conditions.

In the illustrated embodiment, the floating-ground detection circuits can include floating-ground OCP detection circuits 404, floating-ground SCP detection circuits 406, and floating-ground RCP detection circuits 408. The first floating-ground OCP detection circuit 404 can detect an OCP condition in the first supply current 401 provided by the power converter 410. The second floating-ground OCP detection circuit 404 can detect an OCP condition in the second supply current 403 provided by the power converter 410. The second floating-ground SCP detection circuit 406 can detect an SCP condition in the first supply current 401 provided by the power converter 410. The second floating-ground SCP detection circuit 406 can detect an SCP condition in the second supply current 403 provided by the power converter 410. The first floating-ground RCP detection circuit 408 can detect an RCP condition in the first supply current 401 provided by the power converter 410. A second of the floating-ground RCP detection circuits 408 can detect an RCP condition in the second supply current 403 provided by the power converter 410.

In another embodiment, the power controller 402 is a dual-port USB Type-C controller in the two-port charger system 400. In other embodiments, the power controller 402 is part of a USB-PD subsystem used in various applications. In at least one embodiment, the power controller 402 can be used in, or in connection with, a vehicle entertainment system. In at least one embodiment, the power controller 402 includes a connector that connects to other subsystems of the vehicle entertainment system. Alternatively, the connector can connect to other systems, such as a head-unit charger, a rear-seat charger, a charger of an entertainment system, or the like.

Figure 5:
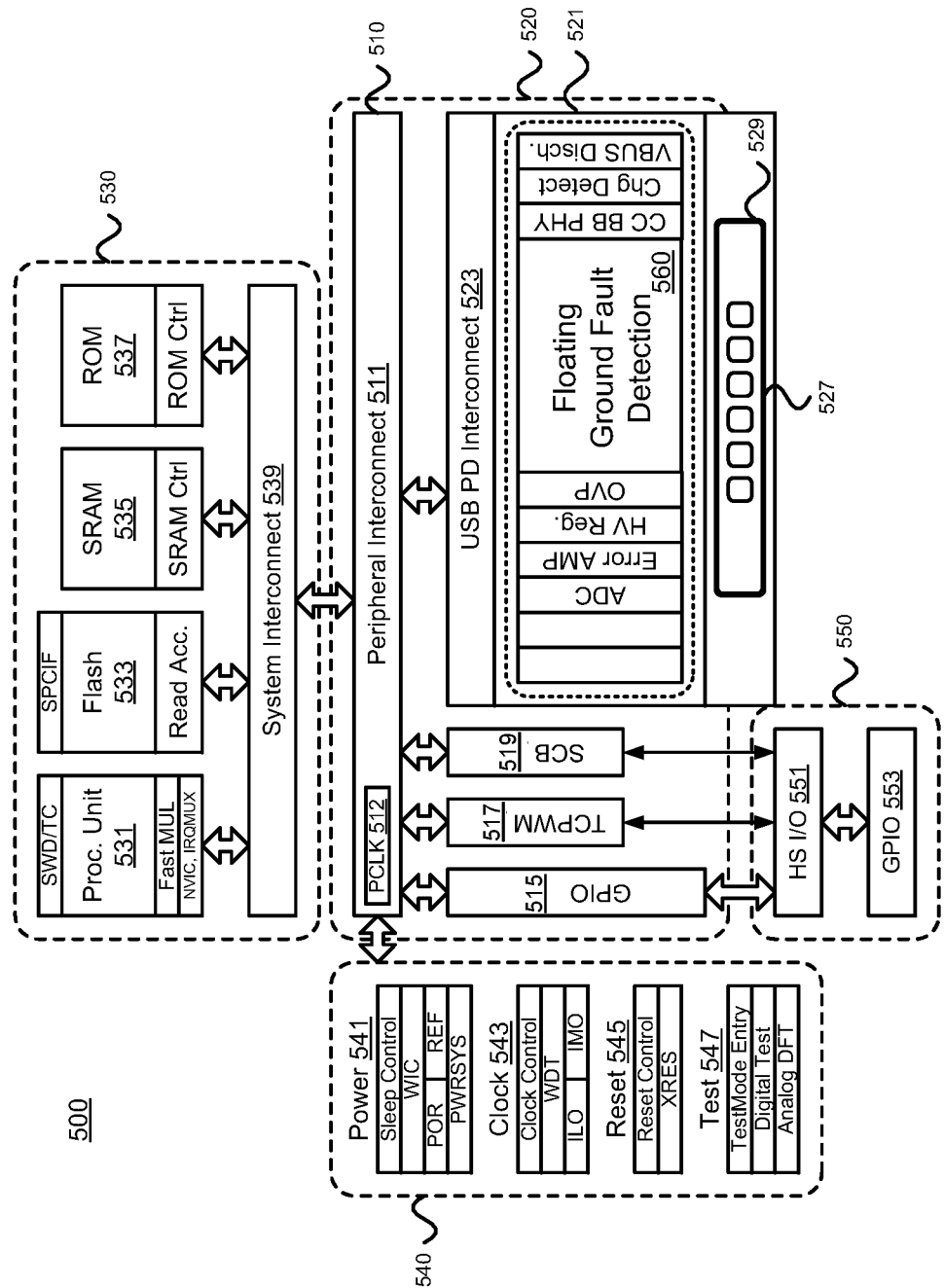
FIG. 5 is a block diagram illustrating a system for a USB device with floating ground fault detection in USB power delivery in accordance with some embodiments.

FIG. 5 is a block diagram illustrating an integrated circuit (IC) system 500 for a USB device with floating ground fault detection in accordance with some embodiments. System 500 may include a peripheral subsystem 510, including a number of components for use in USB-PD. Peripheral subsystem 510 may include a peripheral interconnect 511 including a clocking module, peripheral clock (PCLK) 512 for providing clock signals to the various components of peripheral subsystem 510. Peripheral interconnect 511 may be a peripheral bus, such as a single-level or multi-level advanced high-performance bus (AHB), and may provide a data and control interface between peripheral subsystem 510, CPU subsystem 530, and system resources 540. Peripheral interconnect 511 may include controller circuits, such as direct memory access (DMA) controllers, which may be programmed to transfer data between peripheral blocks without input by, control of, or burden on CPU subsystem 530.

The peripheral interconnect 511 may be used to couple components of peripheral subsystem 510 to other components of system 500. Coupled to peripheral interconnect 511 may be a number of general-purpose input/outputs (GPIOs) 515 for sending and receiving signals. GPIOs 515 may include circuits configured to implement various functions such as pull-up, pull-down, input threshold select, input, and output buffer enabling/disable, single multiplexing, etc. Still, other functions may be implemented by GPIOs 515. One or more timer/counter/pulse-width modulator (TCPWM) 517 may also be coupled to the peripheral interconnect and include circuitry for implementing timing circuits (timers), counters, pulse-width modulators (PWMs) decoders, and other digital functions that may operate on I/O signals and provide digital signals to system components of system 500. Peripheral subsystem 510 may also include one or more serial communication blocks (SCBs) 519 for implementation of serial communication interfaces such as I2C, serial peripheral interface (SPI), universal asynchronous receiver/transmitter (UART), controller area network (CAN), clock extension peripheral interface (CXPI), etc.

For USB power delivery applications, peripheral subsystem 510 may include a USB power delivery subsystem 520 coupled to the peripheral interconnect and comprising a set of USB-PD modules 521 for use in USB power delivery. USB-PD modules 521 may be coupled to the peripheral interconnect 511 through a USB-PD interconnect 523. USB-PD modules 521 may include an analog-to-digital conversion (ADC) module for converting various analog signals to digital signals; an error amplifier (AMP) for regulating the output voltage on VBUS line per a PD contract; a high-voltage (HV) regulator for converting the power source voltage to a precise voltage (such as 3.5-5V) to power system 500; an over-voltage protection (OVP) module for providing over-voltage protection on the VBUS line with configurable thresholds and response times; one or more gate drivers for external power field-effect transistors (FETs) used in USB power delivery in provider and consumer configurations; a communication channel PHY (CC BB PHY) module for supporting communications on a Type-C communication channel (CC) line; and floating-ground detection modules 560. The floating-ground detection modules 560 can include an over-current protection (OCP) module, a short-current protection (SCP) module, and a reverse-current protection (RCP) module for detecting fault conditions as described herein. USB-PD modules 521 may also include a charger detection module for determining that a charging circuit is present and coupled to system 500 and a VBUS discharge module for controlling the voltage discharge on VBUS. USB power delivery subsystem 520 may also include pads 527 for external connections and electrostatic discharge (ESD) protection circuitry 529, which may be required on a Type-C port. USB-PD modules 521 may also include a communication module for retrieving and communicating information stored in non-volatile memory controller with another controller, such as between a primary-side controller and a secondary-side controller of a flyback converter. USB-PD modules 521 may also include one or more modules for floating ground circuits for fault detection as described herein.

GPIO 515, TCPWM 517, and SCB 519 may be coupled to an input/output (I/O) subsystem 550, which may include a high-speed (HS) I/O matrix 551 coupled to a number of GPIOs 553. GPIOs 515, TCPWM 517, and SCB 519 may be coupled to GPIOs 553 through HS I/O matrix 551.

System 500 may also include a central processing unit (CPU) subsystem 530 for processing commands, storing program information, and data. CPU subsystem 530 may include one or more processing units 531 for executing instructions and reading from and writing to memory locations from a number of memories. Processing unit 531 may be a processor suitable for operation in an integrated circuit (IC) or a system-on-chip (SOC) device. In some embodiments, processing unit 531 may be optimized for low-power operation with extensive clock gating. In this embodiment, various internal control circuits may be implemented for processing unit operation in various power states. For example, processing unit 531 may include a wake-up interrupt controller (WIC) configured to wake the processing unit up from a sleep state, allowing power to be switched off when the IC or SOC is in a sleep state. CPU subsystem 530 may include one or more memories, including a flash memory 533, static random access memory (SRAM) 535, and a read-only memory (ROM) 537. Flash memory 533 may be a non-volatile memory (NAND flash, NOR flash, etc.) configured for storing data, programs, and/or other firmware instructions. Flash memory 533 may include a read accelerator and may improve access times by integration within CPU subsystem 530. SRAM 535 may be a volatile memory configured for storing data and firmware instructions accessible by processing unit 531. ROM 537 may be configured to store boot-up routines, configuration parameters, and other firmware parameters and settings that do not change during the operation of system 500. SRAM 535 and ROM 537 may have associated control circuits. Processing unit 531 and the memories may be coupled to a system interconnect 539 to route signals to and from the various components of CPU subsystem 530 to other blocks or modules of system 500. System interconnect 539 may be implemented as a system bus such as a single-level or multi-level AHB. System interconnect 539 may be configured as an interface to couple the various components of CPU subsystem 530 to each other. System interconnect 539 may be coupled to peripheral interconnect 511 to provide signal paths between the components of CPU subsystem 530 and peripheral subsystem 510.

System 500 may also include a number of system resources 540, including a power module 541, a clock module 543, a reset module 545, and a test module 547. Power module 541 may include a sleep control module, a wake-up interrupt control (WIC) module, a power-on-reset (POR) module, a number of voltage references (REF), and a PWRSYS module. In some embodiments, power module 541 may include circuits that allow system 500 to draw and/or provide power from/to external sources at different voltage and/or current levels and support controller operation in different power states, such as active, low-power, or sleep. In various embodiments, more power states may be implemented as system 500 throttles back operation to achieve a desired power consumption or output. Clock module 543 may include a clock control module, a watchdog timer (WDT), an internal low-speed oscillator (ILO), and an internal main oscillator (IMO). Reset module 545 may include a reset control module and an external reset (XRES) module. Test module 547 may include a module to control and enter a test mode as well as testing control modules for analog and digital functions (digital test and analog DFT).

System 500 may be implemented as an IC in a monolithic (e.g., single) semiconductor die. In other embodiments, various portions or modules of system 500 may in implemented on different semiconductor dies. For example, memory modules of CPU subsystem 530 may be on-chip or separate. In still other embodiments, some separate-die circuits may be packaged into a single "chip," while other circuits may include external components disposed on a circuit board (or in a USB connector) as separate elements.

System 500 may be implemented in a number of application contexts to provide USB-PD functionality thereto. In each application context, an IC controller or SOC implementing system 500 may be disposed and configured in an electronic device (e.g., a USB-enabled device) to perform operations in accordance with the techniques described herein. In one example embodiment, a system 500 may be disposed and configured in a personal computer (PC) power adapter for a laptop, a notebook computer, etc. In another example embodiment, system 500 may be disposed and configured in a power adapter (e.g., a wall charger) for a mobile electronic device (e.g., a smartphone, a tablet, etc.). In another example embodiment, system 500 may be disposed and configured in a wall socket that is configured to provide power over USB Type-A and/or Type-C port(s). In another example embodiment, system 500 may be disposed and configured in a car charger that is configured to provide power over USB Type-A and/or Type-C port(s). In yet another example embodiment, system 500 may be disposed and configured in a power bank that can get charged and then provide power to another electronic device over a USB Type-A or Type-C port. In other embodiments, a system like system 500 may be configured with the floating ground and fault detection circuitry described herein and may be disposed in various other USB-enabled electronic or electro-mechanical devices.

It should be understood that a system, like system 500 implemented on or as an IC controller, may be disposed into different applications, which may differ with respect to the type of power source being used and the direction in which power is being delivered. For example, in the case of a car charger, the power source is a car battery that provides DC power, while in the case of a mobile power adapter, the power source is an AC wall socket. Further, in a PC power adapter, the flow of power delivery is from a provider device to a consumer device. In contrast, in the case of a power bank, the flow of power delivery may be in both directions depending on whether the power bank operates as a power provider (e.g., to power another device) or as a power consumer (e.g., to get charged itself). For these reasons, the various applications of system 500 should be regarded in an illustrative rather than a restrictive sense.

Figure 6:
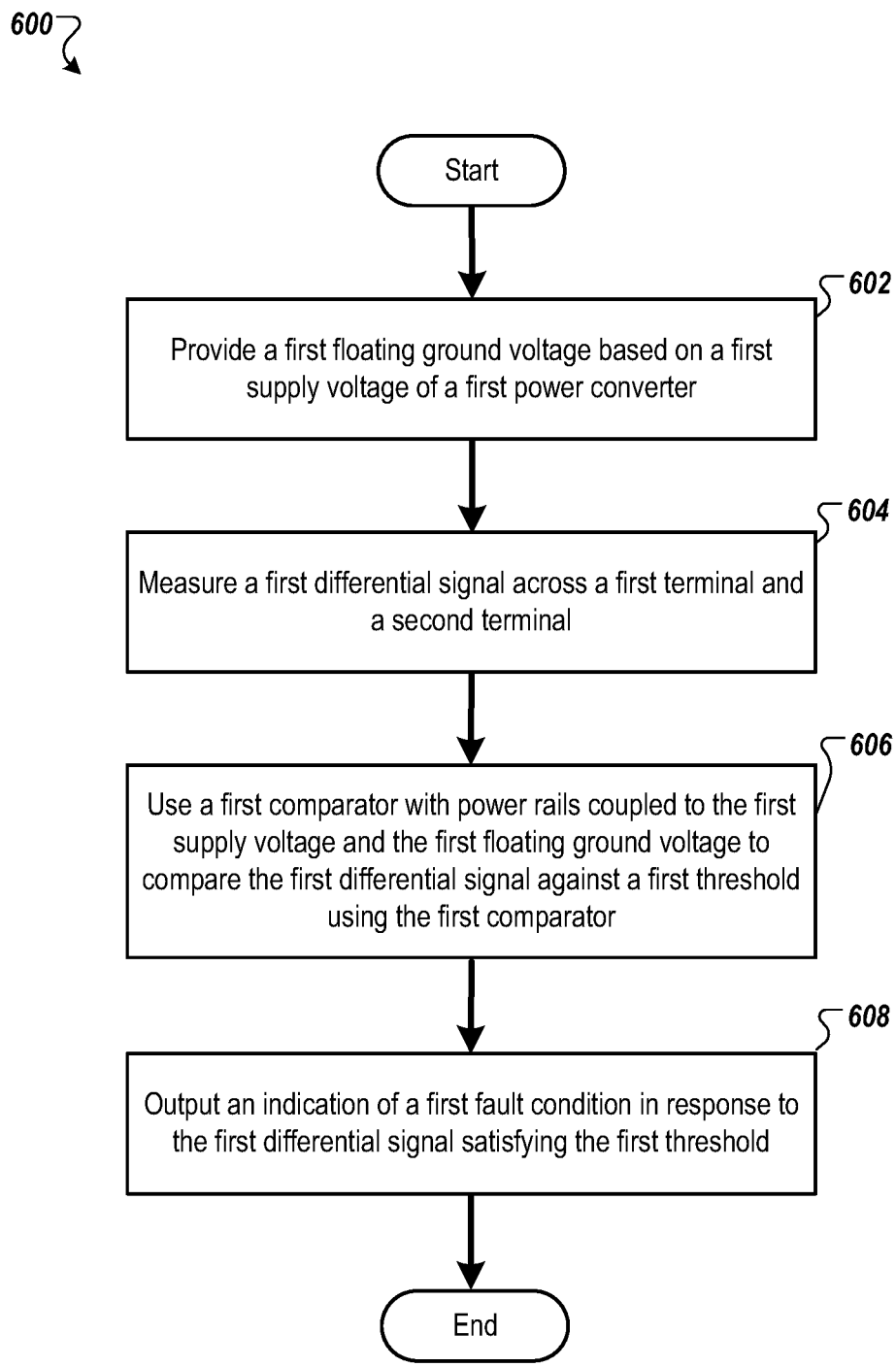
FIG. 6 is a flow diagram of a method of floating-ground fault detection for a USB-PD power device, according to at least one embodiment.

FIG. 6 is a flow diagram of a method 600 of floating-ground fault detection for a USB-PD power device, according to at least one embodiment. The method 600 may be performed by processing logic that comprises hardware (e.g., circuitry, dedicated logic, programmable logic, microcode, etc.), firmware, or a combination thereof. In one embodiment, the method 600 may be performed by any of the processing devices described herein. In one embodiment, the method 600 is performed by the USB-C controller 100 of FIG. 1. In another embodiment, the method 600 is performed by the multi-port USB-PD device 200 of FIG. 2. In another embodiment, the method 600 is performed by the detection circuitry 300 of FIG. 3. In another embodiment, the method 600 is performed by the two-port charger system 400 of FIG. 4. In another embodiment, the method 600 is performed by the system 500 of FIG. 4. In at least one embodiment, the method 600 operates a USB-enabled device with a multi-port integrated circuit (IC) controller. In one embodiment, the processing logic executes a firmware-based method that performs the following operations in conjunction with digital and/or analog circuitry. In another embodiment, the processing logic includes digital/analog circuitry that is configured to perform the following operations.

The method 600 begins by the processing logic providing a first floating ground voltage based on a first supply voltage of a first power converter (block 602). The processing logic measures a first differential signal across a first terminal and a second terminal (block 604). The first terminal is coupled to a first node coupled to the first power converter, and the second terminal is coupled to a second node, where a resistor is coupled between the first node and the second node. The first differential signal represents a first current of the first power converter. The processing logic uses a first comparator with power rails coupled to the first supply voltage and the first floating ground voltage to compare the first differential signal against a first threshold using the first comparator (block 606). The processing logic outputs an indication of a first fault condition in response to the first differential signal satisfying the first threshold (block 608), and the method 600 ends. The first fault condition is an OCP condition, an RCP condition, or an SCP condition.

In a further embodiment, the method 600 can be performed using a second comparator and a second threshold to detect a second fault condition. The method 600 can be performed using a third comparator and a third threshold to detect a third fault condition.

In at least one embodiment, the processing logic adjusts a first output signal from the first comparator to a second output signal, the second output signal having the indication of the first fault condition.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "driving," "receiving," "controlling," "pulling down," "shorting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example" or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or." Unless specified otherwise or clear from context, "X includes A or B" is intended to mean any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus for performing the operations herein. This apparatus may be specially constructed for the required purposes, or it may comprise firmware instructions stored in suitable storage medium. For example, such firmware instructions may be stored in a non-transitory computer-readable storage medium, such as, but not limited to, any type of memory, such as read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium capable of storing, encoding, or carrying a set of instructions for execution by a machine or device, which causes the machine or device to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by a machine or device and that causes the machine or device to perform any one or more of the methodologies of the present embodiments.

The above description sets forth numerous specific details, such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A Universal Serial Bus Type-C (USB-C) controller comprising:
a first floating ground circuit coupled to a first power converter to provide a first floating ground voltage based on a first supply voltage of the first power converter; and
a first fault detection circuit coupled to the first power converter, the first fault detection circuit comprising a first comparator, wherein power rails of the first comparator are coupled to the first supply voltage and the first floating ground voltage, wherein the first fault detection circuit is to:
measure a first differential signal across a first terminal and a second terminal, the first differential signal representing a first current of the first power converter;
compare the first differential signal against a first threshold using the first comparator; and
output an indication of a first fault condition in response to the first differential signal satisfying the first threshold.

2. The USB-C controller of claim 1, wherein the first fault condition is an over-current protection (OCP) condition, a reverse-current protection (RCP) condition, or a short-circuit protection (SCP) condition.

3. The USB-C controller of claim 1, further comprising:
a bias generation circuit to provide a bias voltage, wherein the first fault detection circuit further comprises:
a first resistor network coupled between the first comparator and the first and second terminals; and
a first threshold-setting circuit coupled to the bias generation circuit and between the first comparator and the first and second terminals, wherein the first threshold-setting circuit is to control the first threshold of the first comparator.

4. The USB-C controller of claim 1, wherein the first fault detection circuit comprises:
a first level-shifter circuit coupled to an output of the first comparator, wherein the first level-shifter circuit is to adjust a first output signal from the first comparator to a second output signal, the second output signal comprising the indication of the first fault condition.

5. The USB-C controller of claim 1, further comprising:
a second fault detection circuit coupled to the first power converter, the second fault detection circuit comprising a second comparator, wherein power rails of the second comparator are coupled to the first supply voltage and the first floating ground voltage, wherein the second fault detection circuit is to:
compare the first differential signal against a second threshold using the second comparator; and
output an indication of a second fault condition in response to the first differential signal satisfying the second threshold, wherein the second fault condition and the first fault condition are different.

6. The USB-C controller of claim 5, further comprising:
a bias generation circuit to provide a bias voltage, wherein:
the first fault detection circuit further comprises:
a first resistor network coupled between the first comparator and the first and second terminals; and
a first threshold-setting circuit coupled to the bias generation circuit and between the first comparator and the first and second terminals, wherein the first threshold-setting circuit is to control the first threshold of the first comparator;
the second fault detection circuit further comprises:
a second resistor network coupled between the second comparator and the first and second terminals; and
a second threshold-setting circuit coupled to the bias generation circuit and between the second comparator and the first and second terminals, wherein the second threshold-setting circuit is to control the second threshold of the second comparator.

7. The USB-C controller of claim 1, wherein the first fault detection circuit further comprises:
a first resistor and a second resistor coupled in series between the first terminal and a first input of the first comparator;
a third resistor and a fourth resistor coupled in series between the second terminal and a second input of the first comparator; and
a first threshold-setting circuit coupled to a first node between the first resistor and the second resistor, a second node between the second resistor and the first input of the first comparator, a third node between the third resistor and the fourth resistor, and a fourth node between the fourth resistor and the second input of the first comparator.

8. The USB-C controller of claim 7, wherein the first threshold-setting circuit is programmable, and wherein the first threshold-setting circuit is to cancel a first offset between a first signal at the first node and a second signal at the third node and a second offset between the first signal at the second node and the second signal at the fourth node.

9. The USB-C controller of claim 1, wherein the USB-C controller is a multi-port USB-C controller further comprising:
a second floating ground circuit coupled to a second power converter to provide a second floating ground voltage based on a second supply voltage of the second power converter; and
a second fault detection circuit coupled to the second power converter, the second fault detection circuit comprising a second comparator, wherein power rails of the second comparator are coupled to the second supply voltage and the second floating ground voltage, wherein the second fault detection circuit is to:
measure a second differential signal across a third terminal and a fourth terminal, the second differential signal representing a second current of the second power converter;
compare the second differential signal against a second threshold using the second comparator; and
output a second indication of a second fault condition in response to the second differential signal satisfying the second threshold.

10. The USB-C controller of claim 1, wherein the first power converter is configured to operate in a first voltage range between approximately 3.3 volts to approximately 30 volts, wherein the first fault detection circuit is configured to operate in a second voltage range between approximately 1.2 volts to approximately 5 volts.

11. A system comprising:
a first power converter;
a first Universal Serial Bus Type-C (USB-C) connector;
a Universal Serial Bus Type-C (USB-C) controller coupled to the first USB-C connector, wherein the USB-C controller comprises:

a first floating ground circuit coupled to the first power converter to provide a first floating ground voltage based on a first supply voltage of the first power converter; and a first fault detection circuit coupled to the first power converter, the first fault detection circuit comprising a first comparator, wherein power rails of the first comparator are coupled to the first supply voltage and the first floating ground voltage, wherein the first fault detection circuit is to:

measure a first differential signal across a first terminal and a second terminal, the first differential signal representing a first current of the first power converter;

compare the first differential signal against a first threshold using the first comparator; and output an indication of a first fault condition in response to the first differential signal satisfying the first threshold.

12. The system of claim 11, wherein the first fault condition is an over-current protection (OCP) condition, a reverse-current protection (RCP) condition, or a short-circuit protection (SCP) condition.

13. The system of claim 11, further comprising:

a bias generation circuit to provide a bias voltage, wherein the first fault detection circuit further comprises:

a first resistor network coupled between the first comparator and the first and second terminals; and a first threshold-setting circuit coupled to the bias generation circuit and between the first comparator and the first and second terminals, wherein the first threshold-setting circuit is to control the first threshold of the first comparator.

14. The system of claim 11, wherein the first fault detection circuit comprises:

a first level-shifter circuit coupled to an output of the first comparator, wherein the first level-shifter circuit is to adjust a first output signal from the first comparator to a second output signal, the second output signal comprising the indication of the first fault condition.

15. The system of claim 11, further comprising:

a second fault detection circuit coupled to the first power converter, the second fault detection circuit comprising a second comparator, wherein power rails of the second comparator are coupled to the first supply voltage and the first floating ground voltage, wherein the second fault detection circuit is to:

compare the first differential signal against a second threshold using the second comparator; and output an indication of a second fault condition in response to the first differential signal satisfying the second threshold, wherein the second fault condition and the first fault condition are different.

16. The system of claim 15, further comprising:

a bias generation circuit to provide a bias voltage, wherein:

the first fault detection circuit further comprises:

a first resistor network coupled between the first comparator and the first and second terminals; and a first threshold-setting circuit coupled to the bias generation circuit and between the first comparator and the first and second terminals, wherein the first threshold-setting circuit is to control the first threshold of the first comparator;

the second fault detection circuit further comprises:

a second resistor network coupled between the second comparator and the first and second terminals; and a second threshold-setting circuit coupled to the bias generation circuit and between the second comparator and the first and second terminals, wherein the second threshold-setting circuit is to control the second threshold of the second comparator.

17. The system of claim 11, wherein the first fault detection circuit further comprises:

a first resistor and a second resistor coupled in series between the first terminal and a first input of the first comparator;

a third resistor and a fourth resistor coupled in series between the second terminal and a second input of the first comparator; and a first threshold-setting circuit coupled to a first node between the first resistor and the second resistor, a second node between the second resistor and the first input of the first comparator, a third node between the third resistor and the fourth resistor, and a fourth node between the fourth resistor and the second input of the first comparator, wherein:

the first threshold-setting circuit is programmable; and the first threshold-setting circuit is to cancel a first offset between a first signal at the first node and a second signal at the third node and a second offset between the first signal at the second node and the second signal at the fourth node.

18. The system of claim 11, wherein the USB-C controller is a multi-port USB-C controller further comprising:

a second floating ground circuit coupled to a second power converter to provide a second floating ground voltage based on a second supply voltage of the second power converter; and a second fault detection circuit coupled to the second power converter, the second fault detection circuit comprising a second comparator, wherein power rails of the second comparator are coupled to the second supply voltage and the second floating ground voltage, wherein the second fault detection circuit is to:

measure a second differential signal across a third terminal and a fourth terminal, the second differential signal representing a second current of the second power converter;

compare the second differential signal against a second threshold using the second comparator; and output a second indication of a second fault condition in response to the second differential signal satisfying the second threshold.

19. A multi-port Universal Serial Bus Type-C (USB-C) controller comprising:

a first floating ground circuit coupled to a first power converter to provide a first floating ground voltage based on a first supply voltage of the first power converter, the first power converter to operate at a maximum voltage that is higher than 5 volts; and a first fault detection circuit coupled to the first power converter, the first fault detection circuit comprising a first comparator that operates at approximately 5 volts or less, wherein power rails of the first comparator are coupled to the first supply voltage and the first floating ground voltage, wherein the first fault detection circuit is to detect a first fault condition in a first supply current of the first power converter using the first comparator;

a second floating ground circuit coupled to a second power converter to provide a second floating ground voltage based on a second supply voltage of the second power converter, the second power converter to operate at a maximum voltage that is higher than 5 volts; and a second fault detection circuit coupled to the second power converter, the second fault detection circuit comprising a second comparator that operates at approximately 5 volts or less, wherein power rails of the second comparator are coupled to the second supply voltage and the second floating ground voltage, wherein the second fault detection circuit is to detect a second fault condition in a second supply current of the second power converter using the second comparator.

20. The multi-port USB-C controller of claim 19, wherein:
- the first fault detection circuit is to:
  - measure a first differential signal across a first terminal and a second terminal, the first differential signal representing the first supply current of the first power converter;
  - compare the first differential signal against a first threshold using the first comparator; and
  - output an indication of a first fault condition in response to the first differential signal satisfying the first threshold, wherein the first fault condition is an over-current protection (OCP) condition, a reverse-current protection (RCP) condition, or a short-circuit protection (SCP) condition.

\* \* \* \* \*